(12) United States Patent  
Tokushige

(10) Patent No.: US 7,033,863 B2  
(45) Date of Patent: Apr. 25, 2006

(54) SEMICONDUCTOR DEVICE AND MANUFACTURING METHOD FOR THE SAME

(75) Inventor: Nobuaki Tokushige, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 40 days.

(21) Appl. No.: 10/732,814

(22) Filed: Dec. 11, 2003

(65) Prior Publication Data

US 2004/0137720 A1    Jul. 15, 2004

(30) Foreign Application Priority Data

Jan. 9, 2003    (JP) .............................. 2003-003413

(51) Int. Cl.  
*H01L 21/48*    (2006.01)

(52) U.S. Cl. ........................ 438/113; 438/114; 257/620; 257/621

(58) Field of Classification Search ................ 438/456, 438/462, 464, 928, 113, 114; 148/DIG. 28; 257/620, 621  
See application file for complete search history.

(56) References Cited

U.S. PATENT DOCUMENTS

| 5,071,792 A | 12/1991 | VanVonno et al. |
| 5,702,963 A | 12/1997 | Vu et al. |
| 5,925,924 A | 7/1999 | Cronin et al. |
| 6,051,875 A | 4/2000 | Dando |
| 6,187,677 B1 * | 2/2001 | Ahn ............................ 438/667 |
| 6,204,146 B1 * | 3/2001 | Jenq ............................ 438/424 |
| 6,525,407 B1 * | 2/2003 | Drewery ...................... 257/666 |
| 6,607,970 B1 * | 8/2003 | Wakabayashi ............... 438/462 |
| 6,649,445 B1 * | 11/2003 | Qi et al. ....................... 438/108 |
| 2002/0031897 A1 | 3/2002 | Ueda et al. |

FOREIGN PATENT DOCUMENTS

| EP | 1 351 292 A2 | 10/2003 |
| JP | 10-223626 | 8/1998 |

OTHER PUBLICATIONS

European Search Report mailed Jul. 9, 2004 in corresponding European patent application No. 03029194.2-1235.

* cited by examiner

*Primary Examiner*—Trung Dang  
(74) *Attorney, Agent, or Firm*—Nixon & Vanderhye P.C.

(57) ABSTRACT

A semiconductor device, comprising:
a semiconductor substrate providing a semiconductor element; and
a hard film which covers a part or the entirety of a side of the semiconductor substrate and which has top and bottom surfaces in approximately the same planes as those of the top and bottom surfaces of the semiconductor substrate,
wherein the side of the semiconductor substrate covered with the hard film is processed so as to be perpendicular or substantially perpendicular to the surface of the semiconductor substrate.

7 Claims, 6 Drawing Sheets

Fig. 3A
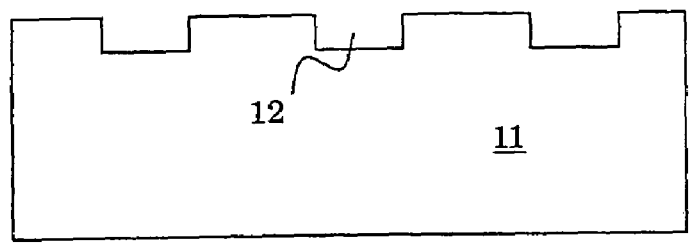
Fig. 3B
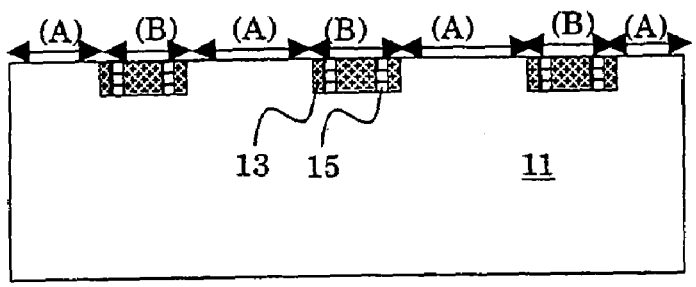
Fig. 3C
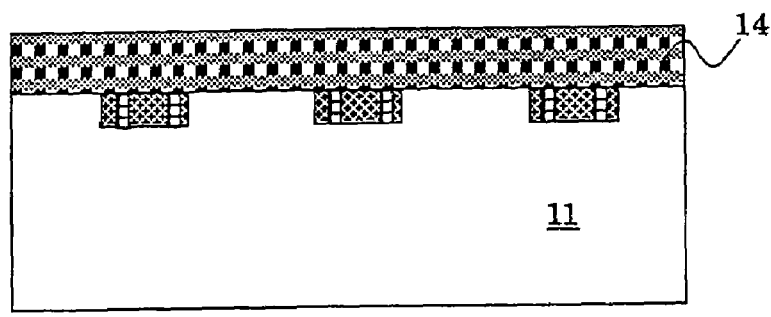
Fig. 3D
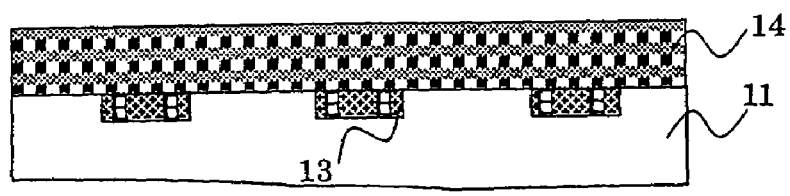
Fig. 3E
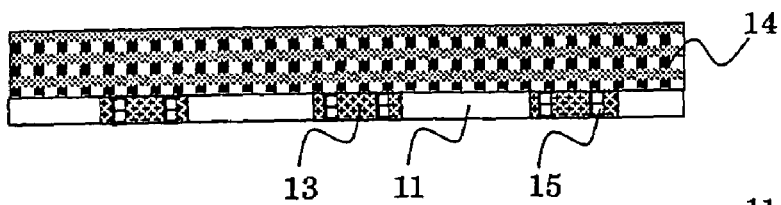
Fig. 3F
Fig. 3G
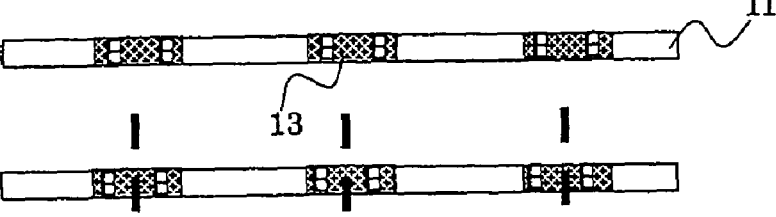

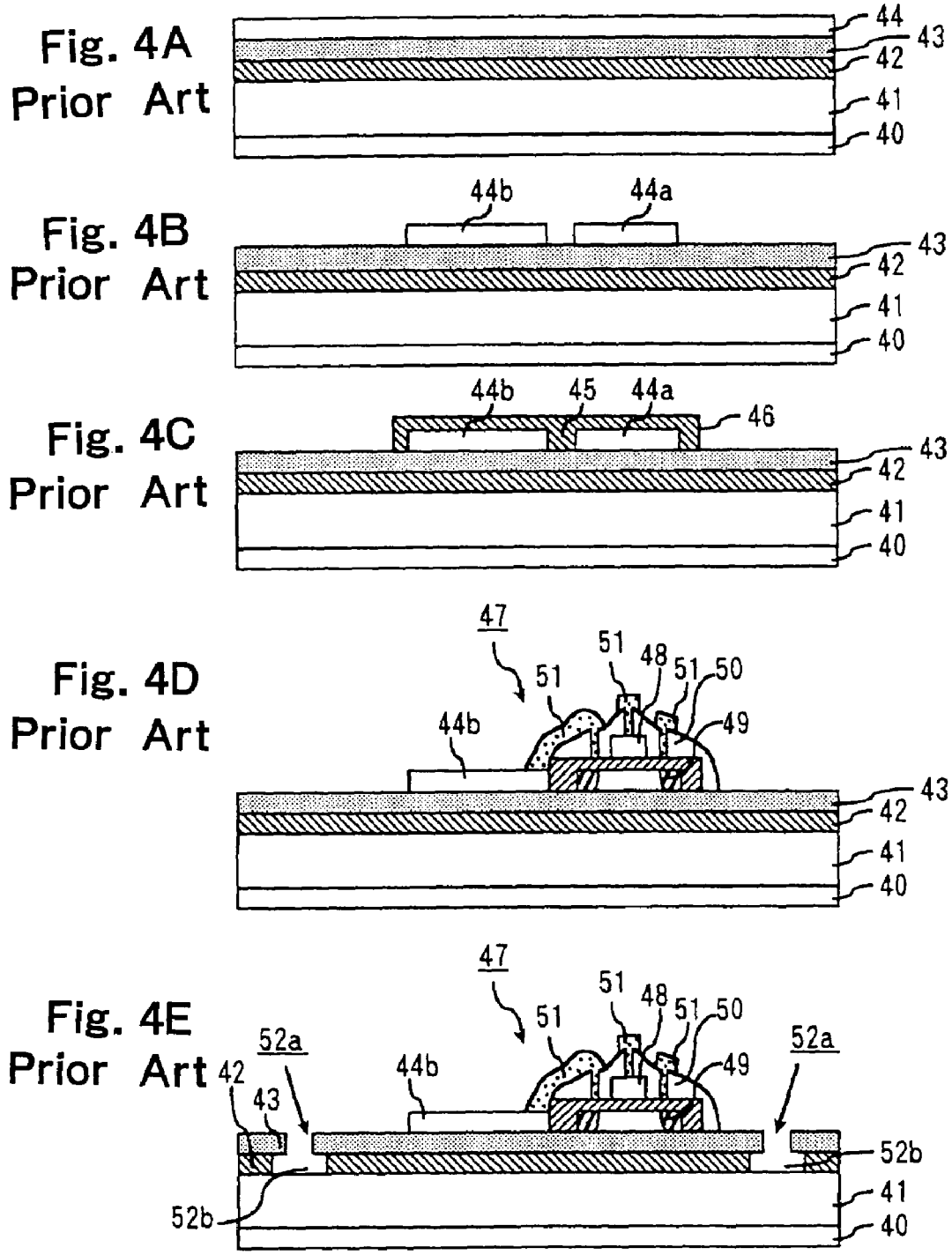

US 7,033,863 B2

SEMICONDUCTOR DEVICE AND MANUFACTURING METHOD FOR THE SAME

CROSS-REFERENCE TO RELATED APPLICATION

This application is related to Japanese application No. 2003-003413 filed on Jan. 9, 2003, whose priority is claimed under 35 USC §119, the disclosure of which is incorporated by reference in its entirety.

BACKGROUND OF THE INVENTION

1. Field of the Invention

The present invention relates to a semiconductor device and a manufacturing method for the same and, more specifically, to a flexible semiconductor device and a manufacturing method for the same.

2. Description of the Background Art

A recent trend, in which devices such as cellular phones have been becoming more and more compact, has enabled them to become more portable, furthermore, wearable computers have been introduced as "personal computers that you can wear".

In addition, interfaces for directly recognizing images and speech sound such as 3DMDs (see through head mounted display), HDs with a CCD camera built in, headset type glasses and headset type microphones have also been introduced and the market for wearable devices is considered to expand in the future.

A method for converting TFT chips for AMLCDs (active matrix displays) into thin films has been proposed as one measure to meet this demand (U.S. Pat. No. 5,702,963).

According to this method, first, as shown in FIG. 4A, a substrate with an SOI structure wherein a Si buffer layer 41, a silicon oxide film 42 formed according to a CVD method, a release layer 43 made of a silicon oxide nitride film, and an upper Si layer 44 serving as an element formation layer are laminated in this order on an Si substrate 40 is used and, as shown in FIG. 4B, a pixel portion (pixel region) 44b and a TFT region 44a for an AMLCD are formed on the lamination.

Next, as shown in FIG. 4C, an oxide film 46 is formed on the pixel portion 44b and the TFT region 44a so as to form an insulator region 45.

Furthermore, as shown in FIG. 4D, a gate electrode 48 and source/drain regions 49 are formed on the substrate that has been obtained in the above-described manner and, furthermore, this is covered with an insulating film 50 and contact holes and wires 51 are formed on desired regions of the insulating film 50 so as to obtain a TFT 47.

After that, as shown in FIG. 4E, an opening 52a is formed in a release layer 43 located on the outside of the region that includes the pixel portion 44b and the TFT region 44a and, furthermore, an opening 52b that is greater than the opening 52a is formed in the silicon oxide film 42.

Subsequently, as shown in FIG. 5F, a support pillar 53 is formed of a silicon oxide film so as to fill in the openings of the silicon oxide film 42 and the release layer 43, an etchant introduction opening 54 is formed in the release layer 43 in a region other than the region that includes the pixel portion 44b and the TFT region 44a surrounded by the support pillar 53, and then an etchant is introduced from this etchant introduction opening 54 so as to remove the silicon oxide film 42 through etching as shown in FIG. 5G and to form a cavity 55. As a result, the pixel portion 44b and the TFT 47 are placed on the release layer 43 that is supported by the support pillar 53.

Next, as shown in FIG. 5H, an epoxy resin 56 and a non-photo sensitive transparent resin film 57 are formed on the entirety of the surface of the obtained substrate, and the epoxy resin 56 over the pixel portion 44b and the TFT region 44a is cured by irradiating it with ultraviolet rays while the transparent film 57 which has not been hardened is removed and the support pillar 53 is cut for cleavage, so that a chip in a thin film form is removed.

Furthermore, a method for covering the sides, or the sides and the bottom surface, of the chip with an insulating film has been proposed in addition to the above-described method (Japanese Unexamined Patent Publication No. HEI 10(1998)-223626).

According to this method, first, as shown in FIG. 6A, circuit elements (not shown) that include transistors are formed and aligned longitudinally and laterally while an insulating film 60a is formed on a semiconductor substrate 66 wherein no electrodes are formed.

Next, as shown in FIG. 6B, the bottom surface of a semiconductor substrate 66 is polished so as to reduce the thickness of the wafer to a predetermined thickness. Subsequently, as shown in FIG. 6C, trenches 62 having a cross-section in the V-form are formed longitudinally and laterally along division lines (scribe area) for dividing the circuit elements on the surface of the semiconductor substrate 66.

After that, as shown in FIG. 6D, another insulating film 60b is formed on the semiconductor substrate 66 so as to cover the surfaces of the trenches 62 and, as shown in FIG. 6E, the insulating film 60b on the surface of the semiconductor substrate 66 is selectively removed so as to expose the surface of the semiconductor substrate 66 and then an electrode is formed on the surface of the semiconductor substrate 66 and a bump is formed on this electrode so as to obtain a bump electrode (protruding electrode) 65.

Next, as shown in FIG. 6F, a tape 63 for polishing is adhered to the entire surface of the semiconductor substrate 66 by means of an adhesive 64 and, as shown in FIG. 6G, the bottom surface of the semiconductor substrate 66 is polished until the bottoms of the trenches 62 are exposed. As a result, the semiconductor substrate 66 is divided in the condition that the semiconductor substrate 66 is adhered to the tape 63 for polishing, so that semiconductor chips are formed.

Subsequently, as shown in FIG. 6H, the tape 63 for polishing and the adhesive 64 are peeled off and an insulating film 60c is formed on the bottom surface of each semiconductor chip as shown in FIG. 6I.

However, according to the methods shown in FIGS. 4A to 4E and FIGS. 5F to 5H, since an SOI substrate is used, the cost of the substrate itself is high, and the already existing technology for designing and processing semiconductor devices in bulk substrates cannot be utilized. In addition, an upper Si layer 44, which is an element formation layer, is deposited directly on the release layer 43; therefore, there is a possibility in that the upper Si layer 44 peels off during the element formation process due to a problem concerning adhesiveness between the upper Si layer 44 and the release layer 43 (adhesiveness depends on the surface form of the lower release layer), leading to a problem of a lack of flexibility due to the relative unevenness of the film thickness of the upper Si layer 44. Furthermore, the film thickness of the semiconductor layer is determined by the film thickness of the upper Si layer 44 on the SOI substrate; therefore, a problem arises wherein the film thickness cannot be freely set so that the semiconductor layer exhibits a desired flexibility and light transmission.

In addition, according to the method shown in FIGS. 6A to 6I, the insulating film that serves as a stopper exists inside of the V-form trenches; therefore, there is a possibility of causing unevenness of the film thickness or cracks in the substrate due to stress being concentrated on the bottom of the V-form trenches resulting in a lack of control when polishing the substrate. Therefore, a problem arises wherein the film thickness cannot be freely set so that the semiconductor layer exhibits a desired flexibility and light transmission.

SUMMARY OF THE INVENTION

The present invention has been made to solve such problems and an object of the present invention is to provide a semiconductor device and a manufacturing method for the same, wherein flexibility and light transmission can be provided to a chip itself in a thin film form.

The present invention provides a semiconductor device comprising a semiconductor substrate providing a semiconductor element and a hard film which covers a part or the entirety of a side of the semiconductor substrate and which has top and bottom surfaces in approximately the same planes as those of the top and bottom surfaces of the semiconductor substrate, wherein the side of the semiconductor substrate covered with the hard film is processed so as to be perpendicular or substantially perpendicular to the surface of the semiconductor substrate.

The present invention also provides a manufacturing method for a semiconductor device, comprising the steps of:

(a) forming a recess in a semiconductor substrate, the semiconductor substrate having a semiconductor element, the recess being located in a region of the semiconductor substrate where the semiconductor element is not formed, the recess is being perpendicular to a surface of the semiconductor substrate;

(b) filling the recess with a material of a hard film;

(c) adhering a support substrate to the surface of the semiconductor substrate, the surface includes the recess, and making the bottom surface of the semiconductor substrate retrogress until a bottom surface of the hard film is exposed; and (d) dividing the semiconductor substrate into pieces by cutting the hard film.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 3A to 3G are cross-sectional views showing manufacturing steps according to another manufacturing method for a semiconductor device of the present invention;

FIGS. 4A to 4E are cross-sectional views showing manufacturing steps for a conventional semiconductor device;

DETAILED DESCRIPTION OF THE INVENTION

Figure 1A:
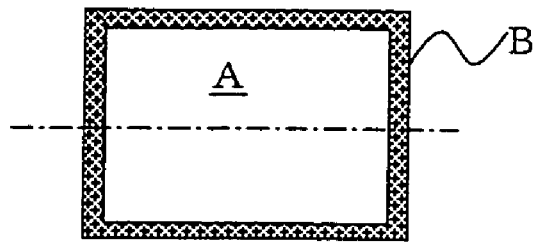
FIGS. 1A to 1E are plan views and cross-sectional views showing a semiconductor device according to an embodiment of the present invention.

A semiconductor device of the present invention is mainly comprises a semiconductor substrate and a hard film that covers at least a part of a side of the semiconductor substrate.

The semiconductor substrate is not particularly limited as long as it is one of the types that are conventionally utilized for semiconductor devices, and examples thereof include substrates of element semiconductors such as silicon and germanium; substrates of compound semiconductors such as GaAs, InGaAs and ZnSe; epitaxial substrates wherein epitaxial layers of the above semiconductors are formed on semiconductor substrates so as to have a thickness of, for example, approximately 1 µm; and substrates where semiconductor layers are formed on insulating substrates such as of glass and plastic. In particular, a single crystal or polycrystal silicon substrate is preferable. Element isolation regions, elements such as transistors, capacitors and resisters, interlayer insulating films and circuits made of combinations thereof may be formed in a single or multiple layer structure on the semiconductor substrate. In addition, impurities may be doped so that the resistance of the semiconductor substrate is set at a predetermined value. Although the film thickness of the semiconductor substrate is not particularly limited, it is preferable for the film thickness to allow the substrate to bend in accordance with the material thereof in the case where stress is applied to the substrate, that is, to allow the substrate to secure a so-called flexibility and/or it is preferable for the film thickness to allow the substrate to exhibit light transmission. Specifically, an example of the film thickness includes in a range from approximately 1 to 60 µm.

A part or the entirety of a side of the semiconductor substrate is covered with the hard film, which will be described later, and it is necessary for the side that is covered with the hard film to be perpendicular or substantially perpendicular to the surface of the semiconductor substrate. Herein, "substantially perpendicular" indicates the state of being substantially perpendicular, forming approximately 90°±5°, to the surface of the semiconductor substrate.

Although the material of the hard film is not particularly limited as long as it has an etching or polishing rate lower than that of the semiconductor substrate, it is preferable for the hard film to be made of an insulating material. Specific examples thereof include a silicon oxide film, a silicon nitride film and a lamination thereof. The hard film covers a part or the entirety of a side of the semiconductor substrate and "a part" in this case indicates a part of the outer periphery of the semiconductor substrate and does not indicate a part in the thickness direction. That is, it is suitable for the hard film that covers a side of the semiconductor substrate to have top and bottom surfaces being in approximately the same planes with the top and bottom surfaces, respectively, of the semiconductor substrate in the covering portion. Accordingly, it is suitable for the film thickness of the hard film to coincide with the film thickness of the semiconductor substrate. It is necessary to form the hard film so that the hard film has a width to a degree that the flexibility of the semiconductor substrate is not excessively lost and it is suitable for the width of the hard film to be from approximately 50 to 200 µm in the longitudinal direction or in the lateral direction of the surface of the semiconductor substrate.

A through hole may be formed in the hard film and a through electrode may be formed by filling the inside of the through hole with a conductive material. The film thickness of the through electrode coincides with the film thicknesses of the semiconductor substrate and of the hard film and, accordingly, it is suitable for the through electrode has top and bottom surfaces which are in approximately the same planes as those of the top and bottom surfaces, respectively, of the semiconductor substrate and of the hard film. The conductive material forming the through electrode is not particularly limited as long as it is a conductive material that can be utilized for a conventional electrode, and examples thereof include amorphous, single crystal or polycrystal N-type or P-type element semiconductors (e.g., silicon or germanium) or compound semiconductors (e.g., GaAs, InP, ZnSe, CsS); metals such as gold, platinum, silver, copper and aluminum; a high melting point metal such as titanium, tantalum and tungsten; single layer films or multilayer films of silicide or polycide of the high melting point metal. In particular, the high melting point metal is preferable. The size of the through hole can be appropriately adjusted in accordance with the size (width in the direction perpendicular to the direction of the length of the hard film) of the hard film.

In addition, according to the manufacturing method for a semiconductor device of the present invention, first, a recess is formed in a region of a semiconductor substrate, where a semiconductor element is formed, on the semiconductor substrate so as not to be located in the region and the recess is perpendicular to the surface of the semiconductor substrate in step (a). The recess can be formed as a hole that does not penetrate or as a trench according to a method well known in the art such as photolithography and an etching process. The depth of the recess can be appropriately adjusted in accordance with the thickness of the semiconductor substrate to be obtained taking flexibility and/or light transmission into consideration as described above, and the depth includes a range from approximately 1 to 60 µm. It is preferable for the bottom of the recess to be parallel to the surface of the semiconductor substrate. The recess can be formed in the entirety or in a part of the region such as of scribe lines where no semiconductor element are formed. Although only one recess may be formed in the semiconductor substrate, it is preferable to form a plurality of recesses. Although it is appropriate for all of the recesses to have the same depth in the case where a plurality of recesses is formed, it is unnecessary for the recesses to have the same size (length, width or diameter in the plane direction of the substrate).

Next, the recess is filled in with a hard film in step (b). The filling of the hard film can be implemented according to a method well known in the art, for example, by forming a hard film on the entire surface of the semiconductor substrate that includes the recess so as to have a film thickness greater than the depth of the recess by means of a sputtering method, a CVD method, a deposition method or the like, and by etching or polishing the formed hard film until the surface of the semiconductor substrate is exposed. The etching may be either wet etching or dry etching and a CMP method and the like can used as the polishing. Thereby, the surface of the hard film can be made to be approximately in the same plane with the surface of the semiconductor substrate.

It is noted that a through electrode may be formed in the hard film by forming a through hole in the hard film after the hard film has been filled in the recess and by filling in this through hole with a conductive material. The through hole can be formed to have a desired size according to a method well known in the art such as photolithography and an etching process. In addition, the filling of the conductive material into the through hole can be carried out according to the same method as that for filling in the recess with the hard film as described above.

First, a support substrate is adhered to the surface of the semiconductor substrate, which includes the recess, in step (c). The support substrate may be made of any material and may have any film thickness as long as it can provide the strength for preventing the occurrence of cracks or the like in the semiconductor substrate at the time when the bottom surface of the semiconductor substrate is made to retrogress until the bottom surface of the hard film is exposed in a manner which will be described later. Specific examples of the support substrate include a variety of substrates of metal, plastic, glass, wood, semiconductor and the like. The adhesion may be carried out in a manner such that the semiconductor substrate can be firmly adhered to the support substrate using adhesive, an adhesive tape or the like, thereby cracks in the semiconductor substrate can be prevented from occurring at the time when the semiconductor substrate is converted into a thin film as described below.

Next, the semiconductor substrate is made to retrogress from the bottom surface side until the bottom surface of the hard film is exposed. The retrogression of the semiconductor substrate can be carried out by means of etching or polishing as described above. That is, the hard film has an etching rate or a polishing rate lower than that of the semiconductor substrate, so that the hard film becomes a stopper for the etching or polishing in the case where the semiconductor substrate is retrogressed from the bottom surface and, accordingly, the semiconductor substrate can be converted to a thin film having desired film thickness by retrogressing the semiconductor substrate until the bottom surface of the hard film is exposed wherein the retrogression of the semiconductor substrate does not proceed beyond the depth of the predetermined recesses and, in addition, the bottom surface of the hard film can be made in the same plane as the bottom surface of the semiconductor substrate.

In step (d), the hard film is cut in the region where the hard film is formed, thereby the semiconductor substrate is divided into pieces. The division herein is referred to as a so-called dicing and the semiconductor substrate can be divided into semiconductor chips by cutting the hard film, that is, by arbitrarily cutting the semiconductor substrate itself. It is noted that this dicing may be carried out in the state where the support substrate is adhered to the semiconductor substrate and, after that, the support substrate may be removed, or the dicing may be carried out after the removal of the support substrate.

The semiconductor device according to the present invention is a semiconductor device having so-called flexibility and light transmission and, therefore, can be used in the modes where flexibility and light transmission are particularly required. A variety of applications such as a liquid crystal panel, a memory card and an IC card are included in the modes. In addition, it may be used in an application wherein no flexibility or no light transmission is particularly required.

DESCRIPTION OF THE PREFERRED EMBODIMENTS

In the following, embodiments of the semiconductor device and of the manufacturing method for the same according to the present invention will be described in detail with reference to the drawings.

Embodiment 1

Figure 1B:

A semiconductor device of Embodiment 1 is a semiconductor chip formed of an element portion A and a hard film portion B that covers a part or the entirety of the periphery of the element portion A as shown in FIGS. 1A and 1B. The element portion A, which is flexible, is formed of transistors, capacitors, resisters or a combination thereof on a silicon substrate having a film thickness of approximately 30 µm and a size of 1 mm×2 mm. At least the sides of the silicon substrate covered with the hard film portion B are perpendicular or substantially perpendicular to the surface of the silicon substrate. The hard film portion B is formed of an insulating film, for example, a silicon oxide film so as to have a width of approximately 50 µm, and covers a part or the entirety of the periphery of the element portion A as shown in FIGS. 1D and 1E.

Such a semiconductor chip can be formed according to the following manufacturing method.

Figure 2A:
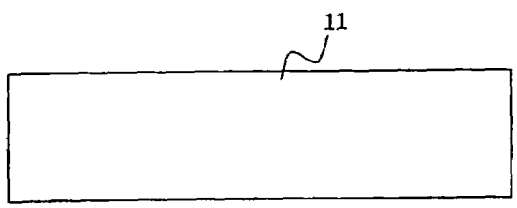
FIGS. 2A to 2H are cross-sectional views showing manufacturing steps according to a manufacturing method for a semiconductor device of the present invention.

First, as shown in FIG. 2A, semiconductor elements (not shown) are formed on a p-type silicon substrate 11 having an impurity concentration of approximately $5 \times 10^{15}$ cm$^{-3}$.

Figure 2B:
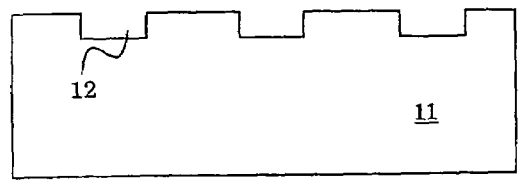

Next, as shown in FIG. 2B, a plurality of recesses 12 having a depth of approximately 30 µm, which corresponds to the film thickness of the semiconductor device to be obtained as shown in FIG. 1B, and having a size of 100 µm×1 mm is formed in regions other than the regions where the semiconductor elements have been formed on the silicon substrate 11. The sides of the recesses 12 are processed so as to be substantially perpendicular to the surface of the silicon substrate 11.

Figure 2C:
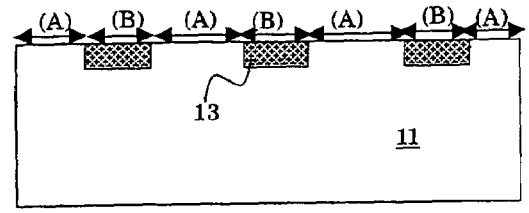
Figure 2C:
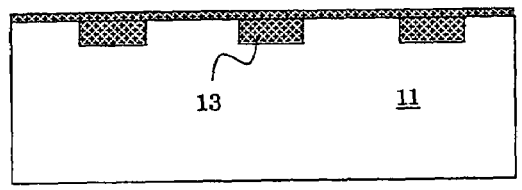

Subsequently, as shown in FIG. 2C, a silicon oxide film 13 is formed on the entirety of the surface of the silicon substrate 11 that includes the recesses 12 according to a plasma CVD method and the silicon oxide film is polished according to a CMP method until the surface of the silicon substrate 11 is exposed, so that the silicon oxide film 13 is filled into recesses 12. In addition, at this time, the polishing by means of CMP may be stopped as shown in FIG. 2C' before the surface of the silicon substrate 11 is exposed so that the silicon oxide film 13 remains on the entirety of the surface of the silicon substrate 11 so as to be used as a protective film at the time when a support substrate 14 is adhered to the silicon substrate.

Figure 2D:
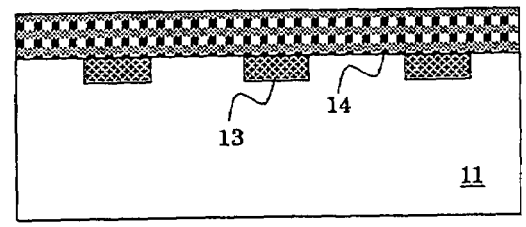
Figure 2E:
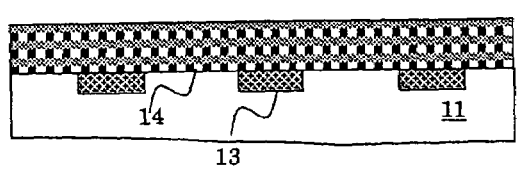
Figure 2F:
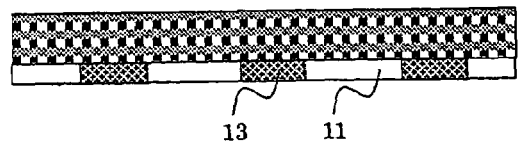

Next, as shown in FIG. 2D, the support substrate 14 made of Al is adhered to the silicon substrate 11 from the recess 12 side, into which the silicon oxide film 13 has been filled, by using for example adhesive and the bottom surface of the silicon substrate 11 is polished as shown in FIG. 2E until the silicon oxide film 13 is exposed, so that the silicon substrate 11 is converted into a thin film as shown in FIG. 2F. At this time, the silicon oxide film 13 has a polishing ratio lower than that of silicon substrate 11 so as to become a stopper for polishing; therefore, the polishing does not proceed beyond the predetermined depth of the recesses 12, so that the silicon substrate 11 having a desired film thickness can be obtained.

Figure 2G:
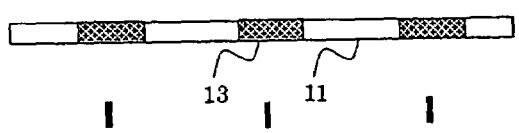
Figure 2H:
Figure 5F:
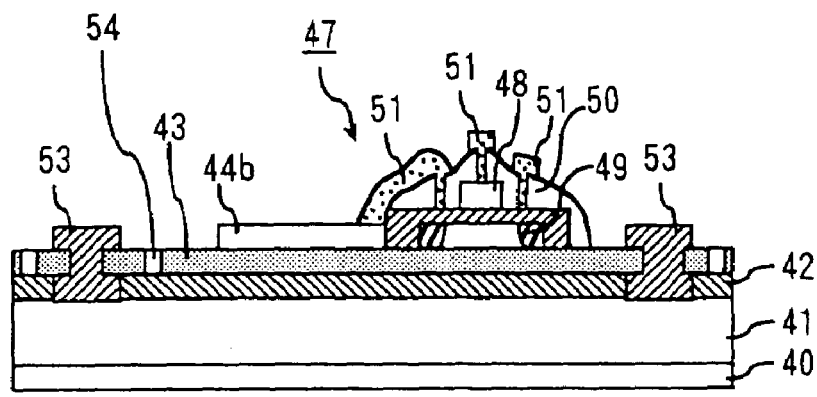
FIGS. 5F to 5H are cross-sectional views showing manufacturing steps following the manufacturing steps of FIGS. 4A to 4E.
Figure 5G:
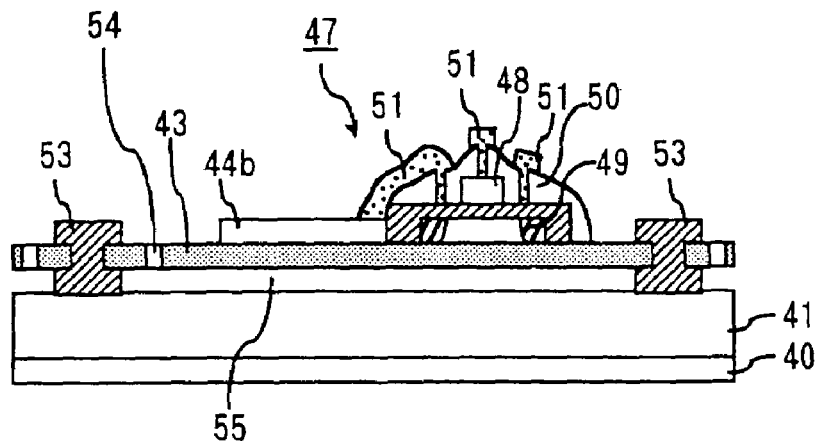
Figure 5H:
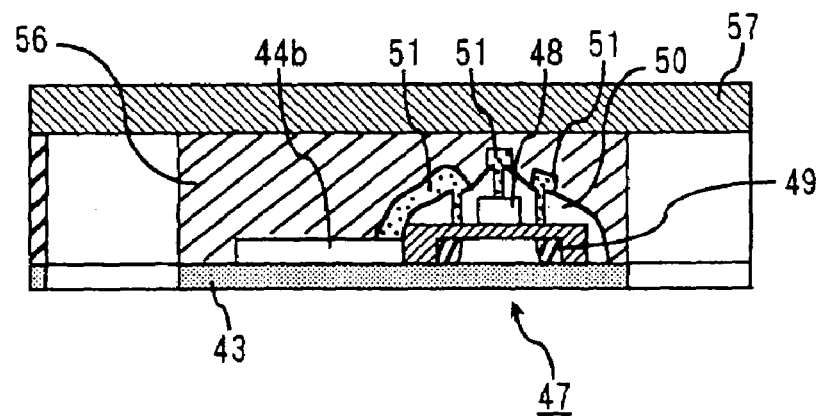
Figure 6A:
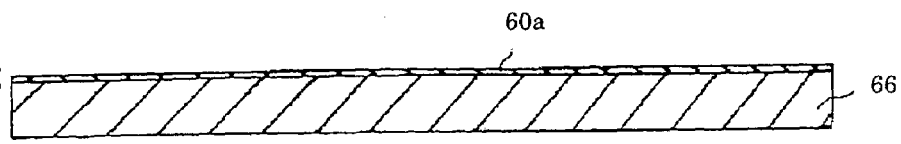
FIGS. 6A to 6I are cross-sectional views showing manufacturing steps for another conventional semiconductor device.
Figure 6B:
Figure 6C:
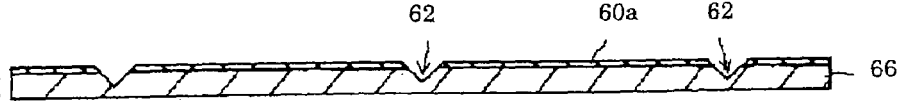
Figure 6D:
Figure 6E:
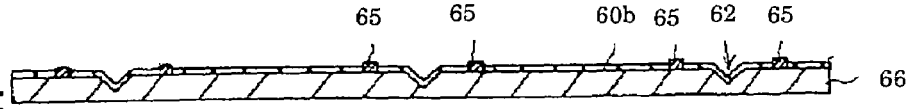
Figure 6F:
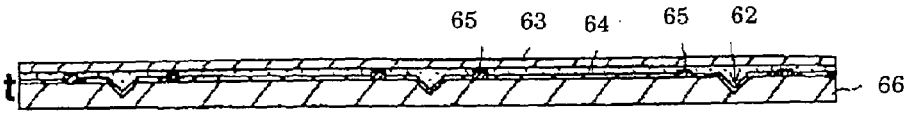
Figure 6G:
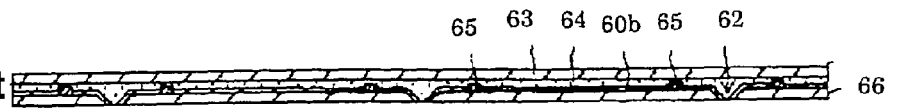
Figure 6H:
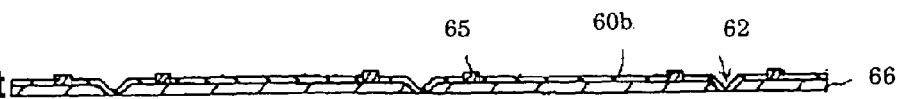
Figure 6I:
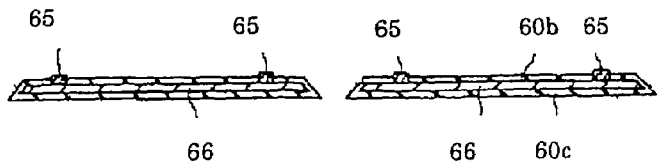

Subsequently, as shown in FIG. 2G, the support substrate 14 is removed from the silicon substrate 11 and dicing is carried out on the portion of the silicon oxide film 13 as shown in FIG. 2H, thereby chips forming semiconductor devices are obtained from the silicon substrate 11.

Figure 1C:
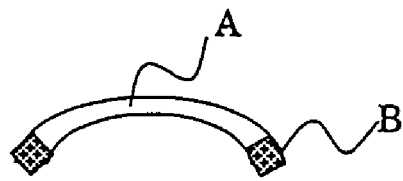
Figure 1D:
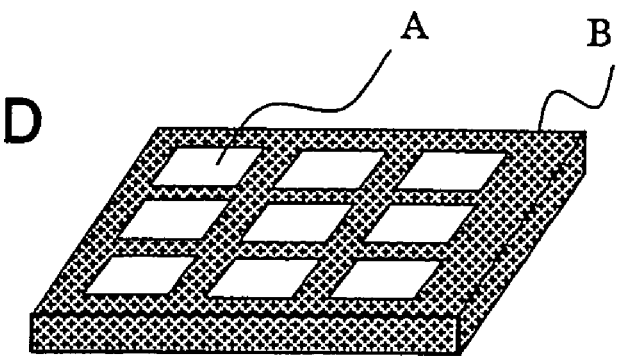
Figure 1E:
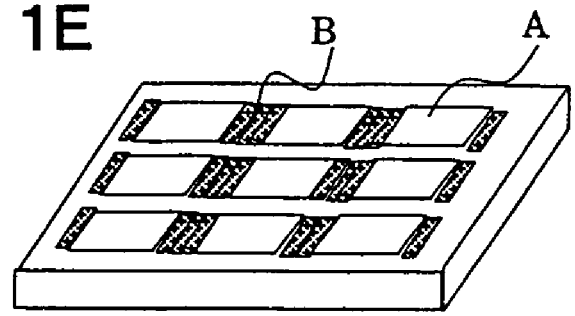

The obtained semiconductor chips are flexible semiconductor chips wherein the end portions thereof are covered with the hard film portions and are bent by pressure applied in one direction so as not to be broken as shown in FIG. 1C. In the case where such a semiconductor chip is mounted on, for example, a plastic liquid crystal panel, the semiconductor chip can stably operate because of the flexibility of the semiconductor chip itself even when some stress is applied to the liquid crystal panel.

Embodiment 2

A semiconductor device of this Embodiment 2 is substantially the same as Embodiment 1 except for the formation of through holes in the hard film portion B and the formation of a through electrode made of tungsten inside of the hole.

Such a semiconductor chip can be formed according to the manufacturing method which will be described later.

First, as shown in FIG. 3A, the recesses 12 are formed in the silicon substrate 11 wherein semiconductor element (not shown) have been formed so that the sides of the recesses 12 become approximately perpendicular to the surface of the silicon substrate 11 are in the same manner as in Embodiment 1.

Next, as shown in FIG. 3B, the recesses 12 are filled in with the silicon oxide film 13 in the same manner as in Embodiment 1. After that, through holes are formed in a part of the silicon oxide film 13 by means of photolithographic and etching processes. Then, the through holes are selectively filled in with tungsten so as to form through electrodes 15.

After that, as shown in FIGS. 3C to 3G, the support substrate 14 is adhered to the silicon substrate 11 in the same manner as in Embodiment 1 and the silicon substrate 11 is converted into a thin film and the support substrate 14 is peeled off followed by dicing, so that semiconductor chips are obtained.

The obtained semiconductor chips are flexible chips wherein the end portions thereof are covered with hard film portions; therefore, a semiconductor chip is mounted on for example, a plastic liquid crystal panel and can stably operate even when stress is applied to the liquid crystal panel.

The present invention provides a semiconductor device comprising: a semiconductor substrate where a semiconductor element is formed on a surface; and a hard film which covers a part or the entirety of a side of this semiconductor substrate and which has top and bottom surfaces in approximately the same planes with the top and bottom surfaces of the semiconductor substrate, wherein the side of the semiconductor substrate covered with the hard film is processed so as to be perpendicular or substantially perpendicular to the surface of the semiconductor substrate; therefore, a high quality semiconductor device having appropriate strength in addition to flexibility and/or light transmission can be provided for implementing high performance. Accordingly, it becomes possible to apply a semiconductor substrate according to the present invention in a foldable, wearable computer or in a display such as liquid crystal displays having light transmission as system package solution that corresponds to miniaturized and portable devices.

In addition, a bulk substrate can be used in place of an SOI substrate; therefore, the substrate itself is inexpensive and the already existing technology for designing and processing semiconductor devices in bulk substrates can be utilized and it becomes possible to lower the total cost from development to production.

Furthermore, according to the manufacturing method for a semiconductor device of the present invention, a semiconductor device can be manufactured in a simple process in comparison with the case where an SOI substrate is used, and in addition, recesses are formed perpendicular to the semiconductor substrate where a hard film is placed in the recesses; therefore, the hard film can be made to function as a stopper or a protective film at the time of retrogression of the semiconductor substrate, for example, at the time of polishing and unevenness of the film thickness and cracks can be prevented from occurring without causing concentration of stress, so that it becomes possible to reduce the manufacturing cost and to increase yield.

What is claimed is:

1. A semiconductor device, comprising:
    a semiconductor substrate providing a semiconductor element, and the semiconductor substrate having a thickness that allows the substrate to secure flexibility and/or to have light transparency; and
    a hard film which covers the entirety of a peripheral side of the semiconductor substrate so that the entire periphery of the semiconductor substrate is covered by the hard film, and which has top and bottom surfaces in approximately the same planes as those of the top and bottom surfaces of the semiconductor substrate,
    wherein the entire peripheral side of the semiconductor substrate covered with the hard film is processed so as to be perpendicular or substantially perpendicular to the surface of the semiconductor substrate.

2. A semiconductor device, comprising:
    a semiconductor substrate providing a semiconductor element, and the semiconductor substrate having a thickness that allows the substrate to secure flexibility and/or to have light transparency;
    a hard film which covers a part or the entirety of a peripheral side of the semiconductor substrate and which has top and bottom surfaces in approximately the same planes as those of the top and bottom surfaces of the semiconductor substrate,
    wherein the entire peripheral side of the semiconductor substrate covered with the hard film is processed so as to be perpendicular or substantially perpendicular to the surface of the semiconductor substrate, and
    wherein the hard film provides a through hole and a through electrode is formed in the through hole so that the through electrode has top and bottom surfaces which are in approximately the same planes as those of the top and bottom surfaces of the hard film.

3. The device of claim 1, wherein the semiconductor substrate is a silicon substrate.

4. The device of claim 1, wherein the hard film is a silicon oxide film or a silicon nitride film.

5. The device of claim 2, wherein the through electrode is formed of a high melting point metal.

6. A manufacturing method for a semiconductor device, comprising the steps of:
    (a) forming a recess in a semiconductor substrate, the semiconductor substrate having a semiconductor element, the recess being located in a region of the semiconductor substrate where the semiconductor element is not formed, the recess having side walls that are perpendicular to a surface of the semiconductor substrate;
    (b) filling the recess with a material of a hard film;
    (c) adhering a support substrate to the surface of the semiconductor substrate having the recess defined therein, and making the bottom surface of the semiconductor substrate retrogress until a bottom surface of the hard film is exposed;
    (d) after making the bottom surface of the semiconductor substrate retrogress until the bottom surface of the hard film is exposed, removing the support substrate from the semiconductor substrate;
    (e) after removing the support substrate, dividing the semiconductor substrate into pieces by cutting the hard film, and
    wherein the hard film is not provided on the top surface of the semiconductor substrate and is not provided on the bottom surface of the semiconductor substrate.

7. A method of making a semiconductor device, comprising:
    (a) forming a recess in a semiconductor substrate, the semiconductor substrate having a semiconductor element, the recess being located in a region of the semiconductor substrate where the semiconductor element is not formed, the recess having side walls that are perpendicular to a surface of the semiconductor substrate;
    (b) filling the recess with a material of a hard film;
    (c) adhering a support substrate to the surface of the semiconductor substrate having the recess defined therein, and making the bottom surface of the semiconductor substrate retrogress until a bottom surface of the hard film is exposed;
    (d) after making the bottom surface of the semiconductor substrate retrogress until the bottom surface of the hard film is exposed, removing the support substrate from the semiconductor substrate;
    (e) after removing the support substrate, dividing the semiconductor substrate into pieces by cutting the hard film; and
    wherein in the step (b), filling the recess with a material of a hard film is followed by forming a through hole in the hard film and filling the through hole with a conductive material to form a through electrode.

* * * * *